United States Patent
Cho et al.

(10) Patent No.: US 6,617,212 B2
(45) Date of Patent: Sep. 9, 2003

(54) SEMICONDUCTOR DEVICE AND METHOD FOR FABRICATING THE SAME USING DAMASCENE PROCESS

(75) Inventors: Heung Jae Cho, Kyoungki-do (KR); Dea Gyu Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/893,650

(22) Filed: Jun. 29, 2001

(65) Prior Publication Data

US 2002/0000623 A1 Jan. 3, 2002

(30) Foreign Application Priority Data

Jun. 30, 2000 (KR) ........................................ 2000-36808

(51) Int. Cl.[7] ...................... H01L 21/336; H01L 21/337; H01L 21/3205; H01L 29/76; H01L 29/94
(52) U.S. Cl. ...................... 438/270; 438/197; 438/183; 438/290; 438/259; 438/589; 257/288; 257/330
(58) Field of Search ................................. 438/183, 270, 438/289, 291, 290, 197, 259, 271, 589, 288, 330, 332

(56) References Cited

U.S. PATENT DOCUMENTS

| | | | | |
|---|---|---|---|---|
| 5,278,165 A | * | 1/1994 | Janssens et al. | 514/259.31 |
| 5,747,838 A | * | 5/1998 | Mishra et al. | 257/192 |
| 5,780,922 A | * | 7/1998 | Mishra et al. | 257/616 |
| 5,798,555 A | * | 8/1998 | Mishra et al. | 257/410 |
| 5,872,031 A | * | 2/1999 | Mishra et al. | 438/216 |
| 5,904,508 A | * | 5/1999 | Codama et al. | 438/151 |
| 6,171,910 B1 | * | 1/2001 | Hobbs et al. | 438/275 |
| 6,251,729 B1 | * | 6/2001 | Montree et al. | 438/257 |
| 6,335,540 B1 | * | 1/2002 | Zhang | 257/53 |
| 6,346,438 B1 | * | 2/2002 | Yagishita et al. | 438/197 |
| 6,406,963 B2 | * | 6/2002 | Woerlee et al. | 438/291 |
| 6,426,532 B1 | * | 7/2002 | Iwata et al. | 257/374 |
| 6,476,454 B2 | * | 11/2002 | Suguro | 257/410 |
| 6,495,437 B1 | * | 12/2002 | Yu | 438/591 |

FOREIGN PATENT DOCUMENTS

| | | | | |
|---|---|---|---|---|
| JP | 406120214 A | * | 4/1994 | |
| JP | 406283529 A | * | 10/1994 | |
| JP | 406334046 A | * | 12/1994 | |

* cited by examiner

*Primary Examiner*—Matthew Smith
*Assistant Examiner*—Chuong A Luu
(74) *Attorney, Agent, or Firm*—Birch, Stewart, Kolasch & Birch, LLP

(57) ABSTRACT

A semiconductor device and a method for fabricating the semiconductor device using a damascene process are disclosed. The method includes forming an $Al_2O_3$ film over a dummy gate disposed over a semiconductor substrate. Next, the dummy gate and a portion of the $Al_2O_3$ film are removed to form a groove defined by remains of the $Al_2O_3$ film and the semiconductor substrate. Then, a subsequent film is deposited within the groove, and a gate material is formed over the second film to complete the semiconductor device.

15 Claims, 9 Drawing Sheets

SEMICONDUCTOR DEVICE AND METHOD FOR FABRICATING THE SAME USING DAMASCENE PROCESS

BACKGROUND OF THE INVENTION

1. Field of the Invention

The present invention relates to semiconductor devices and methods for fabricating semiconductor devices, and more particularly, to semiconductor devices fabricated using a damascene process and methods for fabricating semiconductor devices using a damascene process.

2. Description of Related Art

Generally, as an integration density of a semiconductor device gradually increases, the use of a semiconductor integration technology implementing a damascene process becomes more desirable.

For example, in a semiconductor fabrication process using a metal film as a gate electrode material, the use of the damascene process forms a gate electrode following the formation of a gate pattern and a source/drain region. The process reduces semiconductor substrate loss caused by thermal budgets and plasma. In addition, the use of the damascene process eliminates an oxidation process; therefore, generation of gate electrode defects caused by an oxidation process do not occur.

FIGS. 1A–1E illustrate a known method for forming a gate electrode using a damascene process.

As illustrated in FIG. 1A, a dummy gate insulating film 2 and a dummy gate film 3 are sequentially deposited on a surface of a semiconductor device 1 having a device isolation film. Thereafter, a photoresist pattern 4 is formed on the dummy gate film 3 at a region intended for a gate electrode.

Next, as shown in FIG. 1B, the dummy gate film 3 and the dummy gate insulating film 2 are sequentially etched using the photoresist pattern 4 as a etch barrier, thereby forming a dummy gate electrode 5. The etching process for forming the dummy gate electrode 5 allows a portion of the dummy gate insulating film 2 on the substrate 1 to remain intact.

Then, ions, for example, low concentration n-type impurity ions are implanted into the resulting substrate to form an LDD 6, after which the photoresist pattern 4 is removed. Thereafter, using a known process, spacers 7 are formed on both sidewalls of the dummy gate electrode 5. Then, high concentration n-type impurity ions are implanted into an area reserved for a source/drain, and then the ions are activated by a thermal process to form a source/drain region 8. Then, an interlayer insulating film 9 for insulating the respective devices is deposited on the resulting substrate.

Referring to FIG. 1C, the interlayer insulating film 9 is polished using Chemical Mechanical Polishing (CMP) to expose the dummy gate electrode 5. The exposed dummy gate electrode 5 is then removed by a dry or wet etching process, thereby forming a groove 10 defining a region reserved for a gate electrode. When removing the dummy gate electrode to form the groove 10, the insulation film 2 under the dummy gate film 3 and under a portion of the sidewalls 7 is etched, which forms edges 2a.

Next, as shown in FIG. 1D, a thermal oxide film is grown or a high dielectric film is deposited, on a surface of the groove 10, thereby forming a gate insulating film 11. Next, a doped polysilicon film or a metal film is deposited on the gate insulating film 11 to completely fill the groove 10. As a result, a gate electrode 12 is formed.

The fabricating method of the semiconductor device using the above-described damascene process suffers from the following disadvantages.

As disclosed, the dummy gate electrode and the dummy gate insulating film are removed in sequence to form the groove 10. The process of forming the groove 10 requires the formation of the edges 2a. These edges 2a are recessed as illustrated in FIG. 1C as a result of the etching process. The etched edges 2a are portions that are influenced significantly by a hot carrier upon operation of a transistor. Moreover, the edges 2a significantly influence Gate Oxide Integrity (GOI). Therefore, the edges 2a may prevent the formation of the gate insulating film 11. Moreover, even if the gate insulating film 11 is successfully formed, it will likely be weak. These factors deteriorate the reliability and productivity of the semiconductor device.

SUMMARY OF THE INVENTION

An object of the present invention is to provide a method for fabricating a semiconductor device using a damascene process, which prevents formation of recessed edges in a gate electrode region during etching, thus, improving the reliability of the gate electrode.

Another object of the present invention is to provide a semiconductor device fabricated using a damascene process, where the semiconductor device has improved gate electrode reliability.

In one embodiment, the present invention provides a method for fabricating a semiconductor device using a damascene process, including the steps of forming a dummy gate electrode on a semiconductor substrate having a device isolation film; wet-etching the dummy gate electrode to remove an oxide film on the dummy gate electrode; depositing an $Al_2O_3$ film as a protective film over the semiconductor substrate; heat-treating the substrate on which the $Al_2O_3$ was deposited; implanting low concentration impurity ions into the substrate to form a lightly doped drain (LDD) region; forming spacers on both sidewalls of the dummy gate; implanting high concentration impurity ions into the substrate to form a source/drain region; heat-treating the substrate to activate the implanted high concentration ions; forming an interlayer insulating film on the substrate; polishing and planarizing the interlayer insulating film using a Chemical Mechanical Polishing process to expose the dummy gate electrode; etching the dummy gate electrode and the dummy gate insulating film in sequence to form a groove defining a gate electrode forming region; depositing a gate insulating film on the surface of the groove; and depositing a doped polysilicon film or a gate metal film on the gate insulating film in the groove, thereby forming a gate electrode.

In another embodiment, the present invention provides a method for fabricating a semiconductor device using a damascene process, including the steps of depositing a dummy gate insulating film and a dummy gate electrode on a semiconductor substrate having a device isolation film; depositing an oxide film on over the semiconductor substrate using a LDD oxidation process; wet-etching the dummy gate electrode to remove an oxide film on the dummy gate electrode; depositing an $Al_2O_3$ film as a protective film over the semiconductor substrate; heat-treating the substrate; implanting low concentration impurity ions into the substrate to form a LDD region; forming spacers on both sidewalls of the dummy gate electrode; implanting high concentration impurity ions into the substrate to form a source/drain region; heat-treating the substrate to activate the high concentration impurity ions; forming an interlayer insulating film on the substrate; polishing and planarizing the interlayer insulating film using a Chemical Mechanical Polishing process to expose the dummy gate electrode; etching the dummy gate electrode and the dummy gate insulating film in sequence to form a groove defining a gate electrode region; depositing a gate insulating film on the surface of the groove; and depositing a doped polysilicon film or a gate metal film on the gate insulating film in the groove, thereby forming a gate.

In still another embodiment, the present invention provides a method of fabricating a semiconductor device using a damascene process, including the steps of depositing a dummy gate insulating film and a dummy gate electrode on a semiconductor substrate having a device isolation film; wet-etching the dummy gate electrode so as to remove an oxide film on the dummy gate electrode; depositing an AlON film over the semiconductor substrate; heat-treating the substrate to transform the AlON film into an $Al_2O_3$ film; heat-treating the substrate on which the $Al_2O_3$ was formed; implanting low concentration impurity ions into the substrate to form a LDD region therein; forming spacers on both sidewalls of the dummy gate; implanting high concentration impurity ions into the substrate to form a source/drain region; heat-treating the substrate to activate the high concentration impurity ions; forming an interlayer insulating film on the substrate; polishing and planarizing the interlayer insulating film using a Chemical Mechanical Polishing process to expose the dummy gate electrode; etching the dummy gate electrode and the dummy gate insulating film in sequence to form a groove defining a gate electrode region; depositing a gate insulating film on the surface of the groove; and depositing a doped polysilicon film or a gate metal film on the gate insulating film in the groove, thereby forming a gate.

Moreover, the present invention provides a semiconductor device, including a substrate; an insulating film and a gate material formed over the substrate, the insulating film having a base section narrower than an upper section thereof; and a film formed along sides of the insulating film and the gate material.

BRIEF DESCRIPTION OF THE DRAWINGS

The above and other objects and aspects of the invention will be apparent from the following description of embodiments with reference to the accompanying drawings, in which.

DETAILED DESCRIPTION OF THE INVENTION

A method of fabricating a semiconductor device using a damascene process according to the present invention will now be described in detail with reference to the accompanying drawings.

Figure 1A:
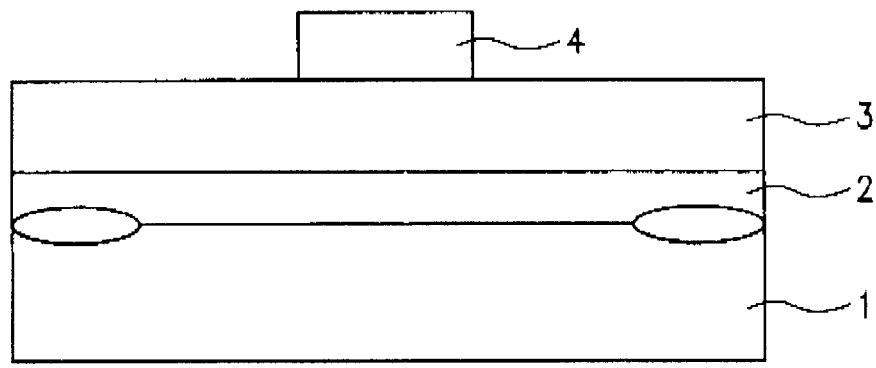
FIGS. 1A to 1D are cross-sectional views showing a fabricating method of a semiconductor device using a damascene process according to the prior art.
Figure 1B:
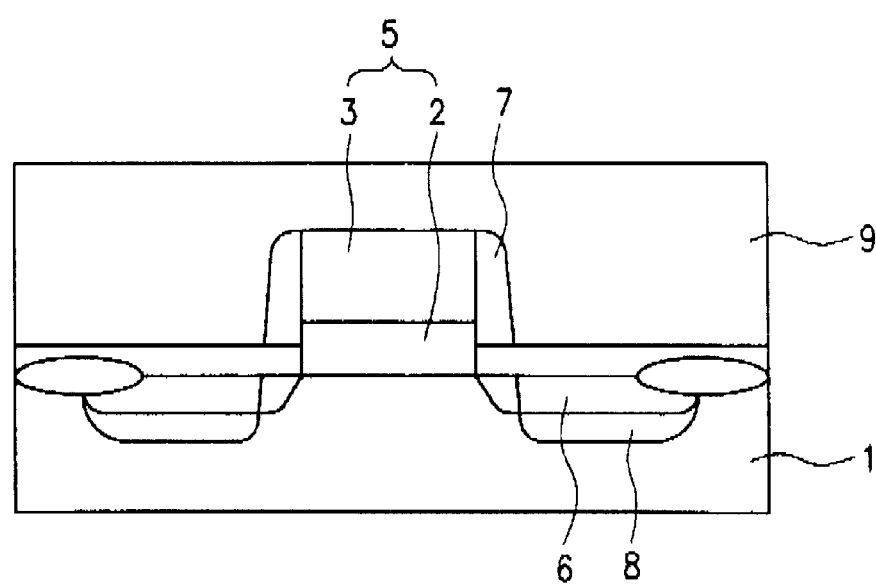
Figure 1C:
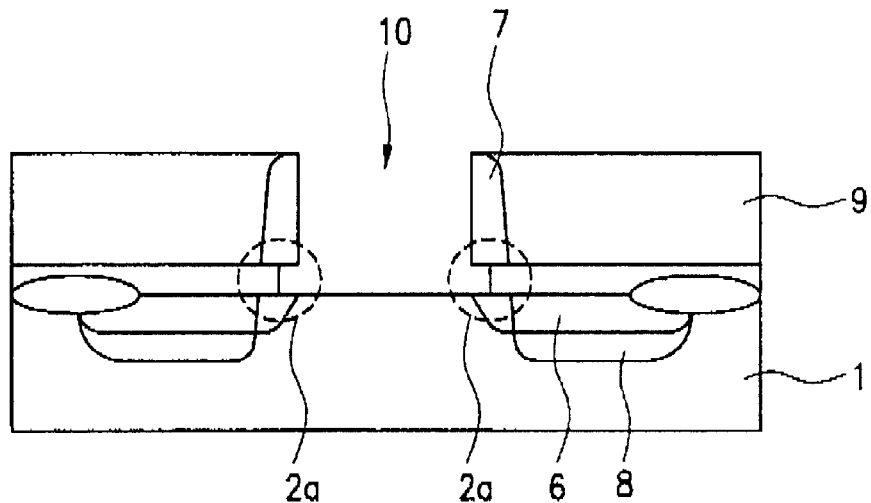
Figure 1D:
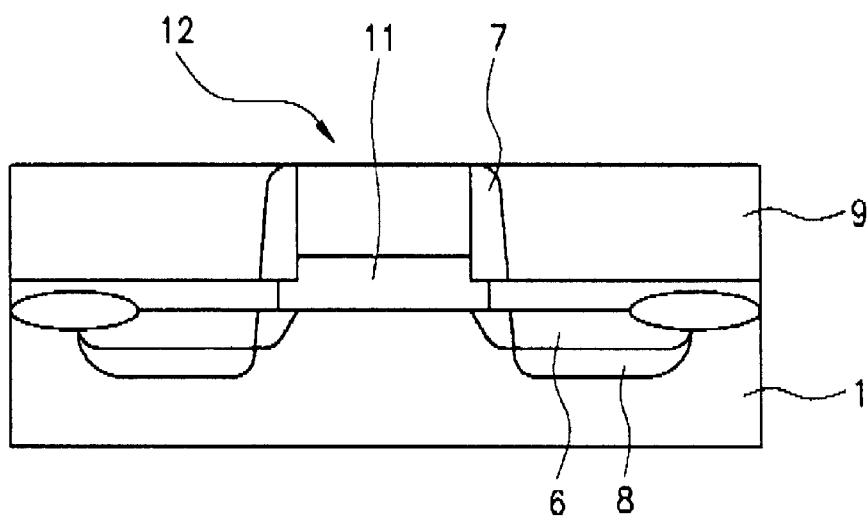
Figure 2A:
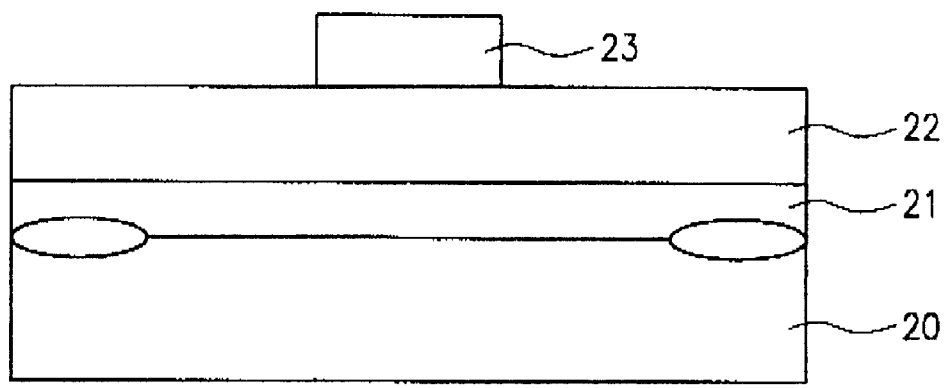
FIGS. 2A to 2G are cross-sectional views showing a fabricating method of a semiconductor device using a damascene process according to one embodiment of the present invention.

Referring to FIG. 2A, a dummy gate oxide film 21 and a dummy gate electrode silicon film 22 are sequentially formed on a surface of a semiconductor substrate 20 having a device isolation film. The dummy gate oxide film 21 is preferably formed having a thickness of 10 to 150 Å. A photoresist pattern 23 is then formed on a gate electrode region of the dummy gate electrode silicon film 22.

Figure 2B:
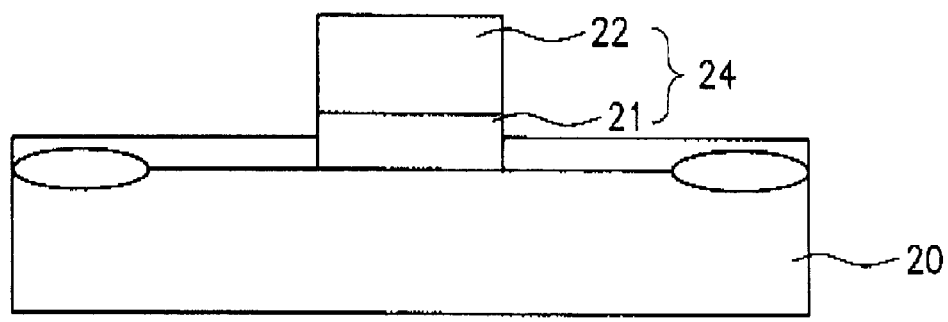

Then, as shown in FIG. 2B, the dummy gate electrode silicon film 22 and the dummy gate oxide film 21 are sequentially etched using the photoresist pattern 23 as an etching barrier, thereby forming a dummy gate 24. The formation of the dummy gate 24 leaves a portion of the gate oxide film 21 on the substrate 20.

Figure 2C:
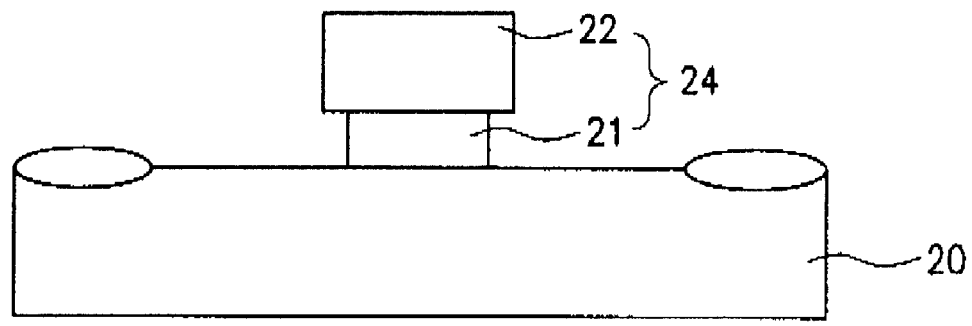

Then, as shown in FIG. 2C, the resulting substrate is wet-etched so as to remove an oxide film (not shown) on the dummy gate 24. Furthermore, the dummy gate oxide film 21 underlying the dummy gate electrode silicon film 22 is also partially etched. The etching of the dummy gate silicon film 22 is controllable depending on a thickness of the dummy gate oxide film 21 and a degree of the wet etching.

Figure 2D:
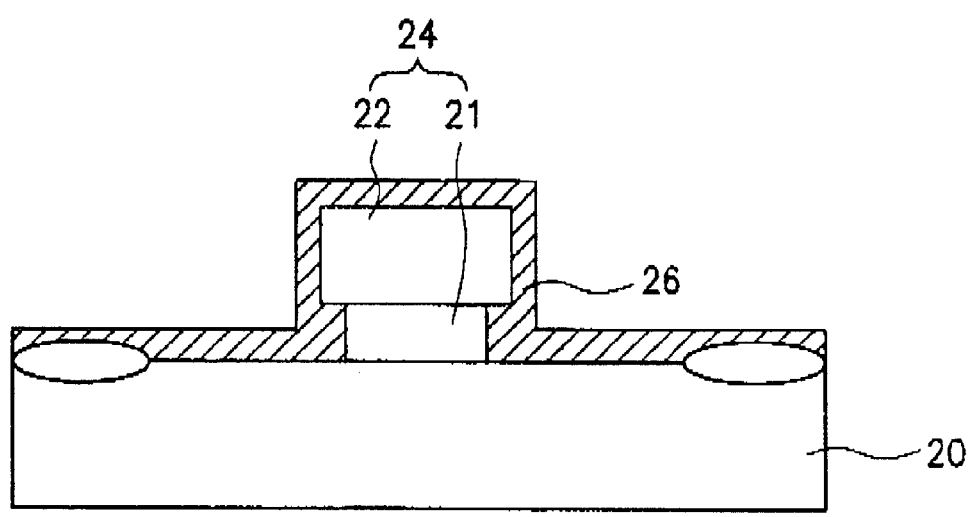

Next, as shown in FIG. 2D, an $Al_2O_3$ film 26, used as a protective film, is deposited over the semiconductor substrate 20. In particular, the film 26 preferably covers the semiconductor substrate 20 and the dummy gate 24. In one embodiment, the $Al_2O_3$ film 26 is formed by depositing an AlON film over the substrate 20, and then the substrate 20 is thermally treated to transform the AlON film into the $Al_2O_3$ film 26. In an alternative embodiment, the $Al_2O_3$ film 26 is deposited by an Atomic Layer Deposition (ALD) process or a Chemical Vapor Deposition (CVD) process. The $Al_2O_3$ film 26 is preferably formed having a thickness of 5 to 500 Å, and then subjected to an inert gas heat treatment (e.g. $O_2$, $N_2O$, etc.) at a temperature of 400 to 1,000° C., such that a subsequent wet etching process is not required.

Other materials may be used in place of $Al_2O_3$ to form a film over the semiconductor substrate 20 and the dummy gate 24. However, a chosen film should be resistant to an etching process (i.e., have an etch selectivity different than the dummy gate 24), thereby ensuring the dummy gate 24 may be etched before etching of the chosen film occurs.

Figure 2E:
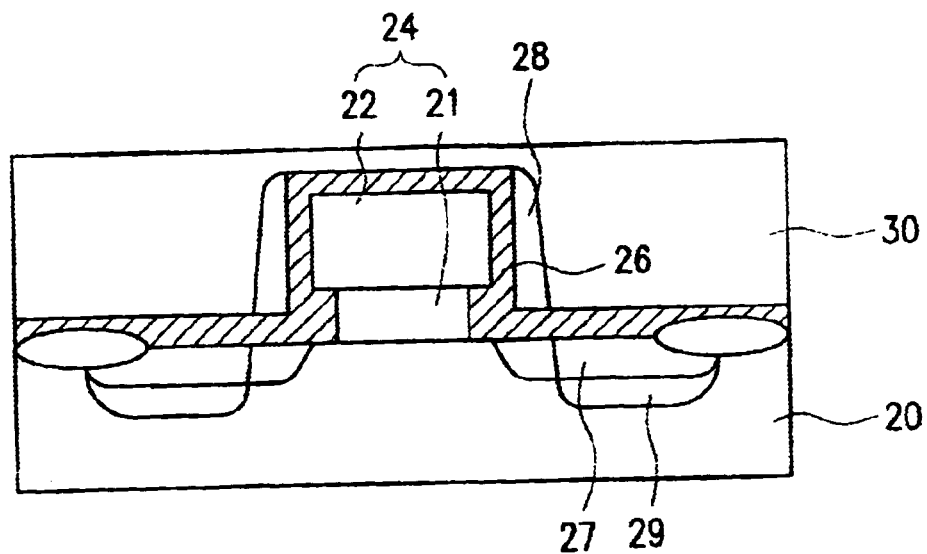

As shown in FIG. 2E, low concentration impurity ions are then implanted into the substrate 20 at an area intended for a source/drain region to form a LDD region 27. Then, spacers 28 are formed on both sidewalls of the dummy gate 24 on which the $Al_2O_3$ film 26 was deposited. Next, high concentration impurity ions are implanted into the resulting substrate to form a source/drain region 29, and the substrate 20 is subjected to a heat treatment to activate the implanted impurity ions. Then, an interlayer insulating film 30 is formed over the entire surface of the substrate 20 to insulate the respective devices.

Figure 2F:
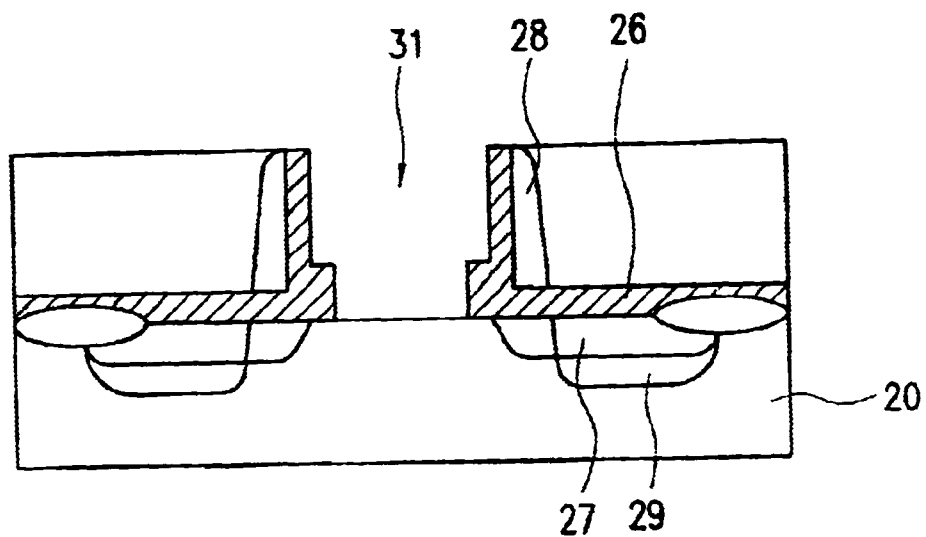

Next, as shown in FIG. 2F, the interlayer insulating film 30 and the $Al_2O_3$ film 26 are polished and planarized by a CMP process until the top surface of the dummy gate 24 is exposed. Then, the dummy gate electrode silicon film 22 and the dummy gate oxide film 21 are sequentially etched to form a groove 31 defining a gate electrode region. The groove 31 is preferably formed using a wet etching process. In forming the groove 31, the $Al_2O_3$ film 26 is not affected by the wet etching process, even when the film $Al_2O_3$ 26 has a thin thickness. Wet etching solutions (e.g., HF or BOF) do not remove the $Al_2O_3$ film 26.

Figure 2G:
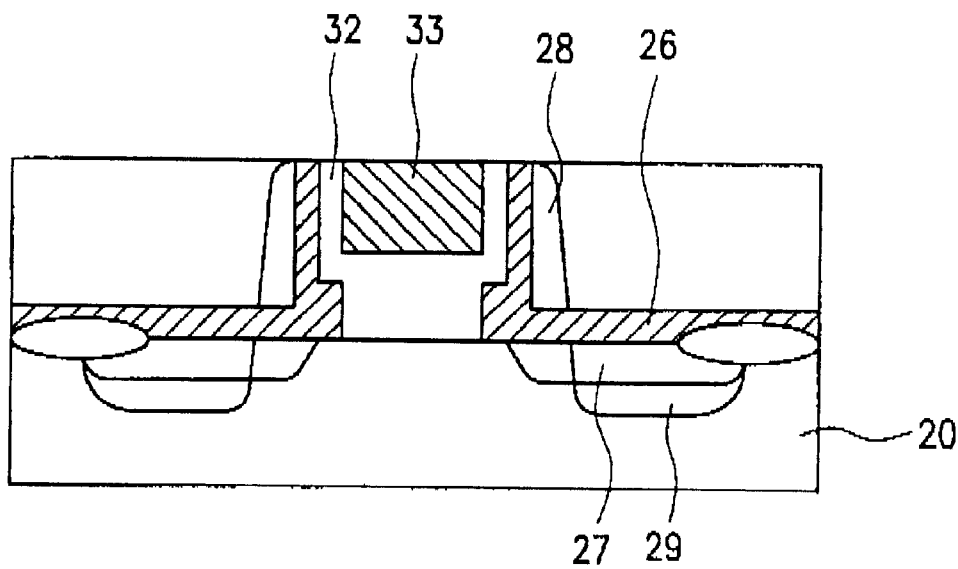

Referring to FIG. 2G, a gate insulating film 32 is deposited over the substrate 20, after which a doped silicon film or a gate electrode metal film 33 is deposited on the gate insulating film 32. The gate insulating film 32 and the gate electrode metal film 33 are polished and planarized to form a gate of the semiconductor device.

Another embodiment of the present invention will now be described in detail with reference to FIGS. 3A to 3G.

Figure 3A:
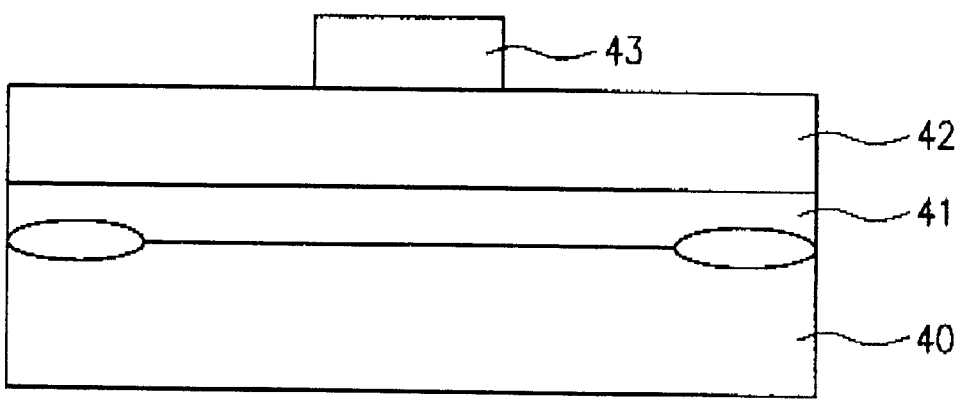
FIGS. 3A to 3G are cross-sectional views showing a fabricating method of a semiconductor device using a damascene process according to another embodiment of the present invention.

Referring to FIG. 3A, a dummy gate oxide film 41 and a dummy gate electrode silicon film 42 are sequentially formed on a surface of a semiconductor substrate 40 having a device isolation film. The dummy gate oxide film 41 is preferably formed having a thickness of 10 to 150 Å. A photoresist pattern 43 is then formed on a gate electrode region of the dummy gate electrode silicon film 42.

Figure 3B:
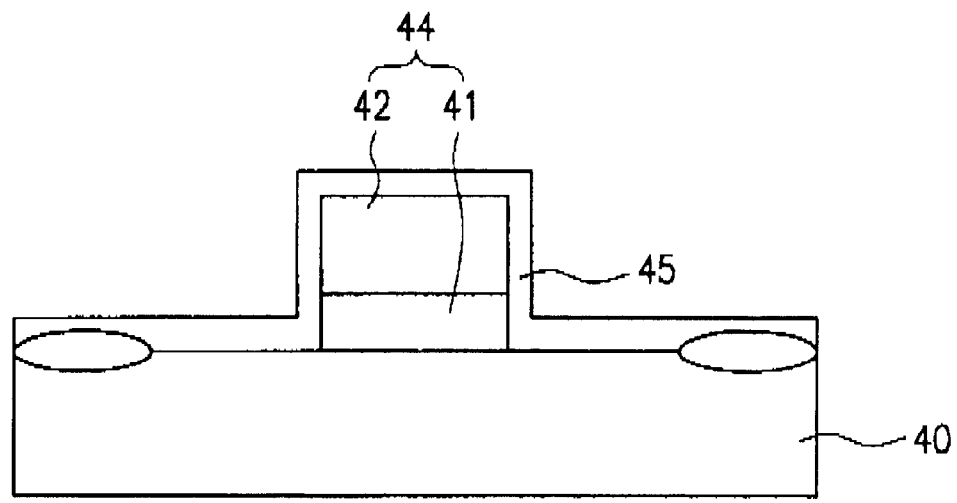

Then, as shown in FIG. 3B, the dummy gate electrode silicon film 42 and the dummy gate oxide film 41 are sequentially etched using the photoresist pattern 43 as an etching barrier, thereby forming a dummy gate 44. The etching process is preferably plasma etching. In order to compensate for semiconductor substrate loss caused by the plasma etching, and to eliminate subsequent ion implantation damage, the semiconductor substrate 40 is subjected to a LDD oxidation process to form a LDD oxide film 45.

Figure 3C:
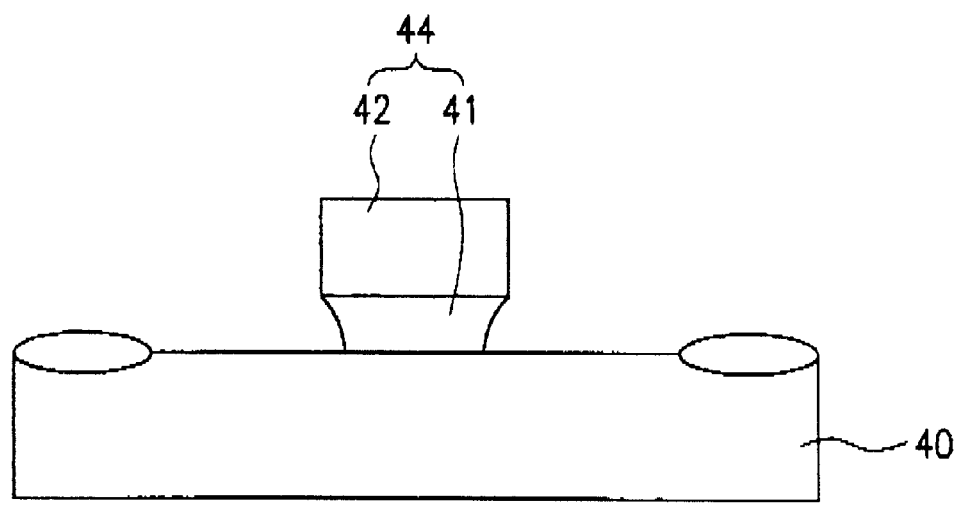

Referring to FIG. 3C, the substrate 40, and the relevant layers are wet-etched to remove the LDD oxide film 45. Moreover, sidewalls of the dummy gate oxide 41, underlying the dummy gate electrode silicon film 42, are also etched to form a sloped curve.

Figure 3D:
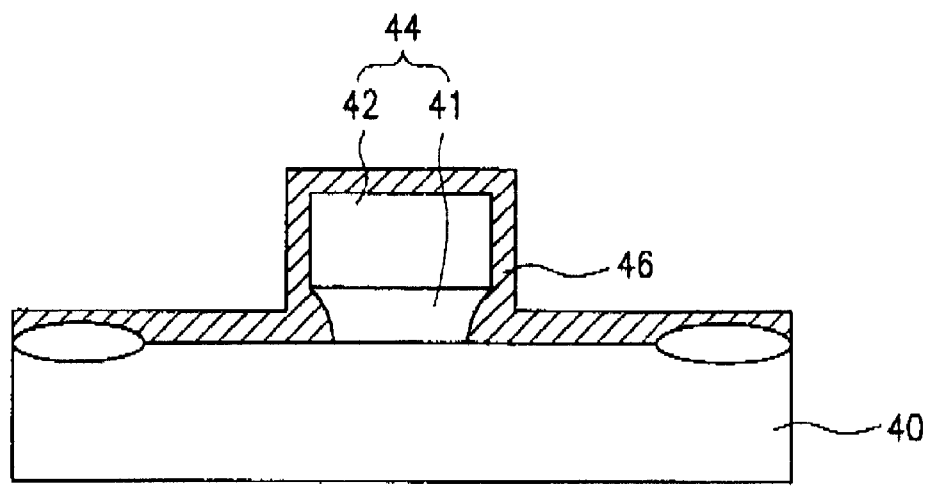

Next, as shown in FIG. 3D, a protective $Al_2O_3$ film 46 is deposited over the substrate 40. In one embodiment, the $Al_2O_3$ film 46 is formed by depositing an AlON film over the substrate 40, and then the substrate 40 is thermally treated to transform the AlON film into the $Al_2O_3$ film. Alternatively, the $Al_2O_3$ film 46 is deposited using an Atomic Layer Deposition (ALD) process or a Chemical Vapor Deposition (CVD) process. The $Al_2O_3$ film 46 is deposited having a thickness of 5 to 500 Å, and then subjected to an inert gas a heat treatment (e.g. $O_2$, $N_2O$, etc.) at a temperature of 400 to 1,000° C., such that a subsequent wet etching process is not required.

Other materials may be used in place of $Al_2O_3$ to form a film over the semiconductor substrate 40 and the dummy gate 44. However, a chosen film should be resistant to an etching process (i.e., have an etch selectivity different than the dummy gate 24), thereby ensuring the dummy gate 44 may be etched before etching of the chosen film occurs.

Figure 3E:
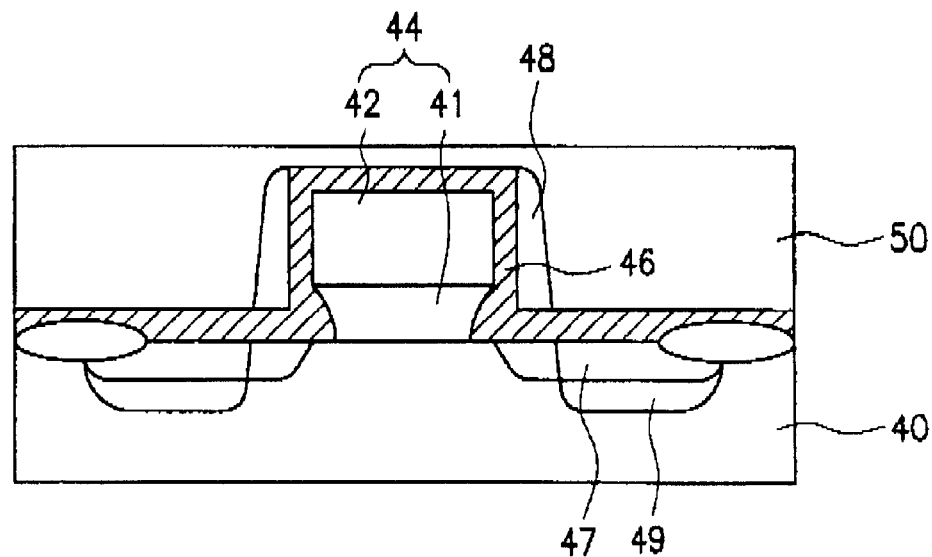

Referring to FIG. 3E, low concentration impurity ions are then implanted into the substrate 40 at an area intended for a source/drain region to form a LDD region 47. Then, spacers 48 are formed on sidewalls of the dummy gate 44 on which the $Al_2O_3$ film 46 was deposited. Next, high concentration impurity ions are implanted into the resulting substrate to form a source/drain region 49, and the substrate 40 is subjected to a heat treatment to activate the implanted impurity ions. Then, an interlayer insulating film 50 is formed over the entire surface of the substrate 40 to insulate the respective devices.

Figure 3F:
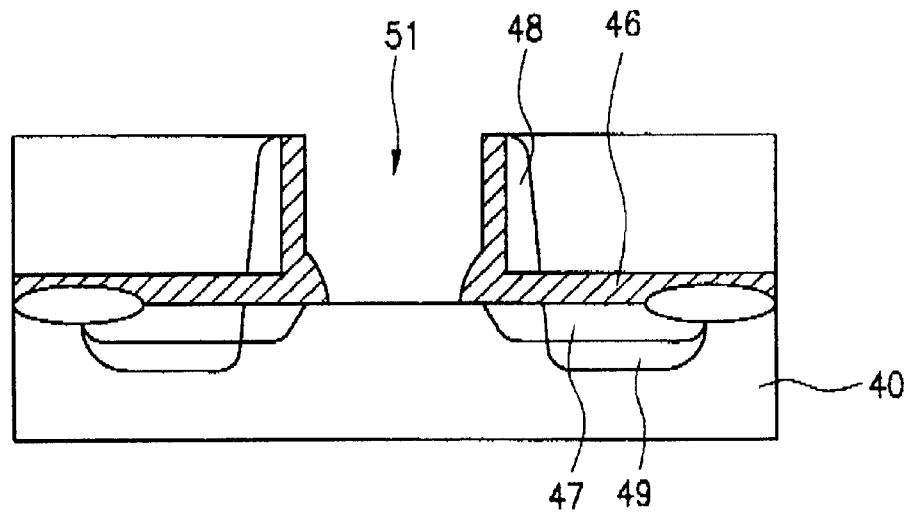

Next, as shown in FIG. 3F, the interlayer insulating film 50 and the $Al_2O_3$ film 46 are polished and planarized by a CMP process until the top surface of the dummy gate 44 is exposed. Then, the dummy gate silicon film 42 and the dummy gate oxide film 41 are sequentially etched to form a groove 51 defining a gate electrode region. The groove 51 is preferably formed using a wet etching process. In forming the groove 51, the $Al_2O_3$ film 46 is not affected by the wet etching process, even when the $Al_2O_3$ film 26 has a thin thickness. Wet etching solutions (e.g., HF or BOF) do not remove the $Al_2O_3$ film 26.

Figure 3G:
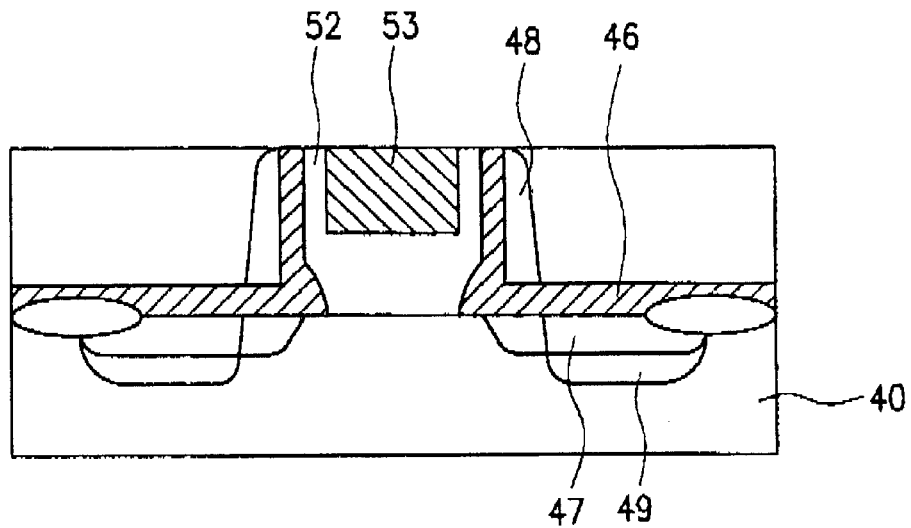

Referring to FIG. 3G, a gate insulating film 52 is deposited over the substrate 40, after which a doped silicon film or a gate electrode metal film 53 is deposited on the gate insulating film 52. The gate insulating film 52 and the gate electrode metal film 53 are polished and planarized to form a gate of the semiconductor device.

As is apparent from the foregoing, the method of the present invention includes forming an $Al_2O_3$ film as a protective film on the surface of a dummy gate. Thus, when a groove is formed by removing a dummy gate electrode silicon film and a dummy gate oxide film, edges of the gate electrode region are protected from etching. The resulting semiconductor device has improved GOI and an increased resistance to a hot carrier. Thus, the reliability and productivity of the semiconductor device are increased.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device using a damascene process, comprising the steps of:

forming a dummy gate electrode on a semiconductor substrate;

forming an $Al_2O_3$ film over the dummy gate electrode and the semiconductor substrate by depositing an AlON film over the substrate and then thermally treating the AlON film to thereby form the $Al_2O_3$ film; polishing and planarizing the $Al_2O_3$ film to expose the dummy gate electrode;

etching the dummy gate electrode to form a groove therein;

forming an insulating film on a surface of the groove; and forming a gate electrode on the insulating film in the groove.

2. The method of claim 1, wherein the $Al_2O_3$ film has a thickness of 10 to 150 Å.

3. The method of claim 1, wherein the $Al_2O_3$ film is deposited by an ALD or CVD process.

4. The method of claim 1, wherein the $Al_2O_3$ film has a thickness of 5 to 500 Å and is subjected to an inert gas heat treatment at a temperature of 400 to 1,000° C.

5. The method of claim 4, wherein the inert gas heat treatment uses a gas selected from one of $O_2$ and $N_2O$.

6. The method of claim 1, wherein the dummy gate electrode comprises a dummy gate insulating film and a dummy gate electrode silicon film.

7. A method for fabricating a semiconductor device using a damascene process, comprising the steps of:

forming a dummy gate on a semiconductor substrate, the dummy gate including a dummy gate insulating film and a dummy gate electrode;

forming an oxide film over the semiconductor substrate using an LDD oxidation process;

wet-etching the oxide film, wherein the dummy gate insulating film is etched to have a selected slope during wet-etching of the oxide film;

forming an $Al_2O_3$ film over the semiconductor substrate and the dummy gate;

forming source and drain regions in the semiconductor substrate;

activating the source and drain regions;

forming an interlayer insulating film over the substrate;

polishing the interlayer insulating film and the $Al_2O_3$ film using a Chemical Mechanical Polishing process to expose the dummy gate electrode;

etching the dummy gate electrode and the dummy gate insulating film in sequence to form a groove defining a gate electrode region;

forming a gate insulating film on a surface of the groove; and forming a doped polysilicon film or a gate metal film on the gate insulating film in the groove.

8. The method of claim 7, wherein the dummy gate insulating film is deposited having a thickness of 10 to 150 Å.

9. The method of claim 7, wherein the $Al_2O_3$ film is formed using an ALD or CVD process.

10. The method of claim 7, wherein the $Al_2O_3$ film has a thickness of 5 to 500 Å and is subjected to an inert gas heat treatment at a temperature of 400 to 1,000° C.

11. The method of claim 7, wherein the $Al_2O_3$ film is formed by depositing an AlON film over the substrate and then thermally treating the AlON film to thereby form the $Al_2O_3$ film.

12. A method of fabricating a semiconductor device using a damascene process, comprising the steps of:

forming a dummy gate on a semiconductor substrate, the dummy gate including a dummy gate insulating film and a dummy gate electrode;

forming an oxide film over the semiconductor substrate using an LDD oxidation process;

wet-etching the oxide film, wherein the dummy gate insulating film is etched to have a selected slope during wet-etching of the oxide film;

depositing an AlON over the semiconductor substrate;

heat-treating the semiconductor substrate to transform the AlON film into an $Al_2O_3$ film;

performing low concentration impurity implantation into the semiconductor substrate to form an LDD region in the substrate;

forming spacers on sidewalls of the dummy gate;

performing high concentration impurity implantation into the semiconductor substrate to form a source/drain region;

heat-treating the substrate to activate the implanted impurity ions;

forming an interlayer insulating film over the semiconductor substrate;

polishing the interlayer insulating film and the $Al_2O_3$ film using a Chemical Mechanical Polishing process to expose the dummy gate electrode;

etching the dummy gate electrode and the dummy gate insulating film in sequence to form a groove defining a gate electrode region;

forming a gate insulating film on a surface of the groove; and forming a doped polysilicon film or a gate metal film on the gate insulating film in the groove, thereby forming a gate of the semiconductor device.

13. The method of claim 12, wherein the dummy gate insulating film is formed having a thickness of 10 to 150 Å.

14. The method of claim 12, wherein the AlON film is deposited by an ALD or CVR process.

15. The method of claim 12, wherein the $Al_2O_3$ film has a thickness of 5 to 500 Å and is subjected to an inert gas heat treatment at a temperature of 400 to 1,000° C.

* * * * *